(12) United States Patent
Kura et al.

(10) Patent No.: US 12,005,707 B2
(45) Date of Patent: Jun. 11, 2024

(54) LIQUID DISCHARGE HEAD AND METHOD FOR MANUFACTURING THE SAME

(71) Applicant: BROTHER KOGYO KABUSHIKI KAISHA, Nagoya (JP)

(72) Inventors: Keiji Kura, Chita (JP); Takashi Aiba, Nagoya (JP); Rui Wang, Nagoya (JP); Shotaro Kanzaki, Handa (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 9 days.

(21) Appl. No.: 17/751,744

(22) Filed: May 24, 2022

(65) Prior Publication Data

US 2022/0379608 A1 Dec. 1, 2022

(30) Foreign Application Priority Data

May 28, 2021 (JP) .................. 2021-089791

(51) Int. Cl.
*B41J 2/14* (2006.01)
*B41J 2/16* (2006.01)
*H10N 30/073* (2023.01)
*H10N 30/20* (2023.01)

(52) U.S. Cl.
CPC ......... *B41J 2/14201* (2013.01); *B41J 2/1607* (2013.01); *B41J 2/1623* (2013.01); *H10N 30/073* (2023.02); *H10N 30/2047* (2023.02)

(58) Field of Classification Search
None
See application file for complete search history.

(56) References Cited

U.S. PATENT DOCUMENTS

2008/0186364 A1* 8/2008 Sugahara ............. B41J 2/161 29/25.35
2020/0324547 A1* 10/2020 Aiba ............ B41J 2/14233

FOREIGN PATENT DOCUMENTS

JP 2020-172061 A 10/2020

* cited by examiner

*Primary Examiner* — Erica S Lin
(74) *Attorney, Agent, or Firm* — Merchant & Gould P.C.

(57) ABSTRACT

A liquid discharge head includes a flow passage member, a sealing member, and an actuator member. The flow passage member is formed with individual flow passages each including a nozzle and a pressure chamber and the flow passage member has a surface on which the pressure chamber is open. The sealing member is arranged on the surface and seals the pressure chamber. The actuator member has a piezoelectric layer, a driving electrode, and a high electric potential portion. The piezoelectric layer is adhered to a first surface of the sealing member on a side opposite to the flow passage member, via a first adhesive having an insulating property. The driving electrode is arranged on a side opposite to the sealing member with respect to the piezoelectric layer at a position overlapped with the pressure chamber in a first direction orthogonal to the surface.

8 Claims, 13 Drawing Sheets

FIG. 3
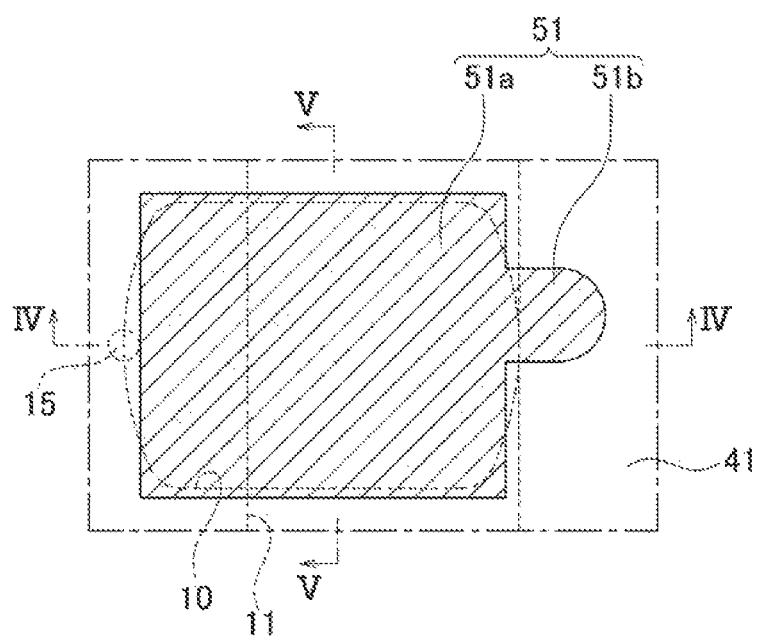
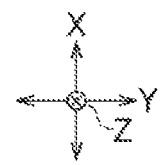

FIG. 10
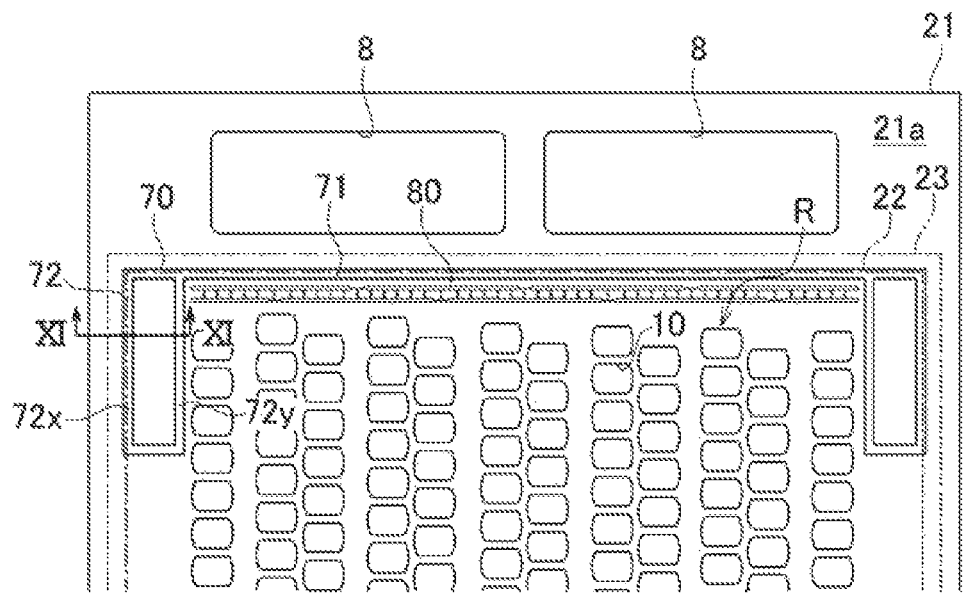
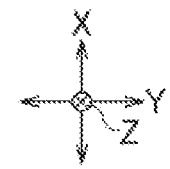
FIG. 11
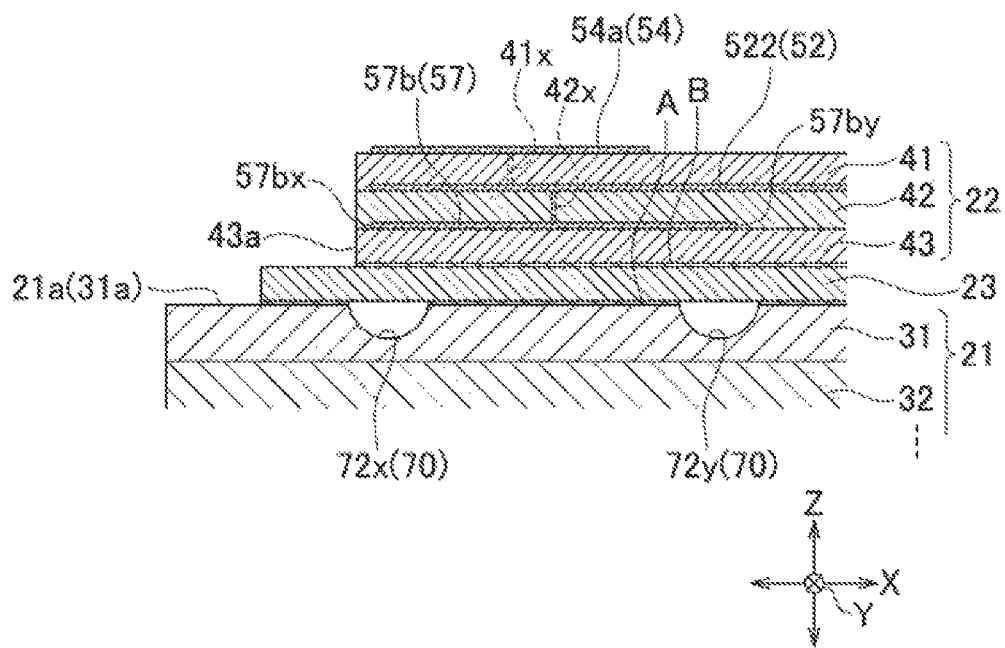

LIQUID DISCHARGE HEAD AND METHOD FOR MANUFACTURING THE SAME

CROSS REFERENCE TO RELATED APPLICATIONS

The present application claims priority from Japanese Patent Application No. 2021-089791 filed on May 28, 2021, the disclosure of which is incorporated herein by reference in its entirety.

BACKGROUND

The present invention relates to a liquid discharge head including a high electric potential portion arranged at an end portion of a piezoelectric layer of an actuator member, and a method for manufacturing the same.

Conventionally, such configuration is known that a vibration plate (sealing member) is arranged between a flow passage unit (flow passage member) and a piezoelectric layer of a piezoelectric element (actuator member), and the piezoelectric layer and the vibration plate are adhered to one another via an adhesive. A conductor film (high electric potential portion), to which a first electric potential (for example, 24 V) is applied, is arranged at an end portion of the piezoelectric layer.

SUMMARY

In the case of the configuration described above, when the sealing member is retained at the low electric potential (for example, at the GND electric potential), the electric field arises at the portion of the piezoelectric layer interposed by the sealing member and the high electric potential portion. Then, the compressive stress acts in accordance with the electric field, and any crack may appear. In order to suppress such a problem, it is conceived that the piezoelectric layer and the sealing member are adhered to one another by the aid of an adhesive having the insulating property. However, it is difficult to uniformly provide the adhesive. For example, if the adhesive is dropped onto a central portion of the piezoelectric layer to adhere the piezoelectric layer and the sealing member, the adhesive hardly spreads to the end portion of the piezoelectric layer. On this account, the thickness of the adhesive is decreased at an end portion of the piezoelectric layer, and a portion, at which the adhesive does not intervene, may appear between the sealing member and the high electric potential portion. In such a situation, any crack may appear at the concerning portion on account of the generation of the electric field and the action of the compressive stress.

Further, when the piezoelectric layer and the sealing member are adhered to one another, the stress is easily concentrated on the end portion of the piezoelectric layer. From this viewpoint, the crack easily appears at the end portion of the piezoelectric layer as well.

An object of the present teaching is to provide a liquid discharge head and a method for manufacturing the same which make it possible to suppress the crack that would otherwise appear at the end portion of the piezoelectric layer.

According to a first aspect of the present teaching, there is provided a liquid discharge head including:

a flow passage member which is formed with a plurality of individual flow passages, each of the individual flow passages including a nozzle and a pressure chamber communicated with the nozzle, the flow passage member having a surface on which the pressure chamber is open;

a sealing member which is arranged on the surface and configured to seal the pressure chamber; and an actuator member which has a piezoelectric layer, a driving electrode, and a high electric potential portion, the piezoelectric layer being adhered to a first surface of the sealing member on a side opposite to the flow passage member, via a first adhesive having an insulating property, the driving electrode being arranged on a side opposite to the sealing member with respect to the piezoelectric layer at a position overlapped with the pressure chamber in a first direction orthogonal to the surface, the high electric potential portion being arranged on a side opposite to the sealing member with respect to the piezoelectric layer at an end portion of the piezoelectric layer in a second direction orthogonal to the first direction, wherein any one of a high electric potential and a low electric potential lower than the high electric potential is selectively applied to the driving electrode, the high electric potential portion is retained at the high electric potential, the sealing member is retained at the low electric potential; and a recess, which is overlapped in the first direction with the high electric potential portion, is formed on at least one of the surface and a second surface of the sealing member on a side opposite to the first surface.

According to a second aspect of the present teaching, there is provided a method for producing a liquid discharge head, the method including:

arranging a sealing member on a surface of a flow passage member formed with a plurality of individual flow passages, to seal a pressure chamber opening on the surface, each of the individual flow passages including a nozzle and the pressure chamber communicated with the nozzle; and adhering a piezoelectric layer of an actuator member via a first adhesive having an insulating property to a first surface of the sealing member on a side opposite to the flow passage member, wherein the actuator member has the piezoelectric layer, a driving electrode, and a high electric potential portion, the driving electrode being arranged on a side opposite to the sealing member with respect to the piezoelectric layer at a position overlapped in a first direction orthogonal to the surface with the pressure chamber, the high electric potential portion being arranged on a side opposite to the sealing member with respect to the piezoelectric layer at an end portion of the piezoelectric layer in a second direction orthogonal to the first direction, any one of a high electric potential and a low electric potential lower than the high electric potential is selectively applied to the driving electrode, the high electric potential portion is retained at the high electric potential the sealing member is retained at the low electric potential, and before sealing the pressure chamber by the sealing member, the method further comprises forming a recess overlapped in the first direction with the high electric potential portion, on at least one of the surface and a second surface of the sealing member on a side opposite to the first surface.

BRIEF DESCRIPTION OF THE DRAWINGS

FIG. 3 is an enlarged view of an area III depicted in FIG. 2.

FIG. 10 is a plan view illustrative of a surface of a flow passage member in an area X depicted in FIG. 2.

FIG. 11 is a sectional view taken along a line XI-XI depicted in FIG. 10.

DETAILED DESCRIPTION

First Embodiment

Figure 1:
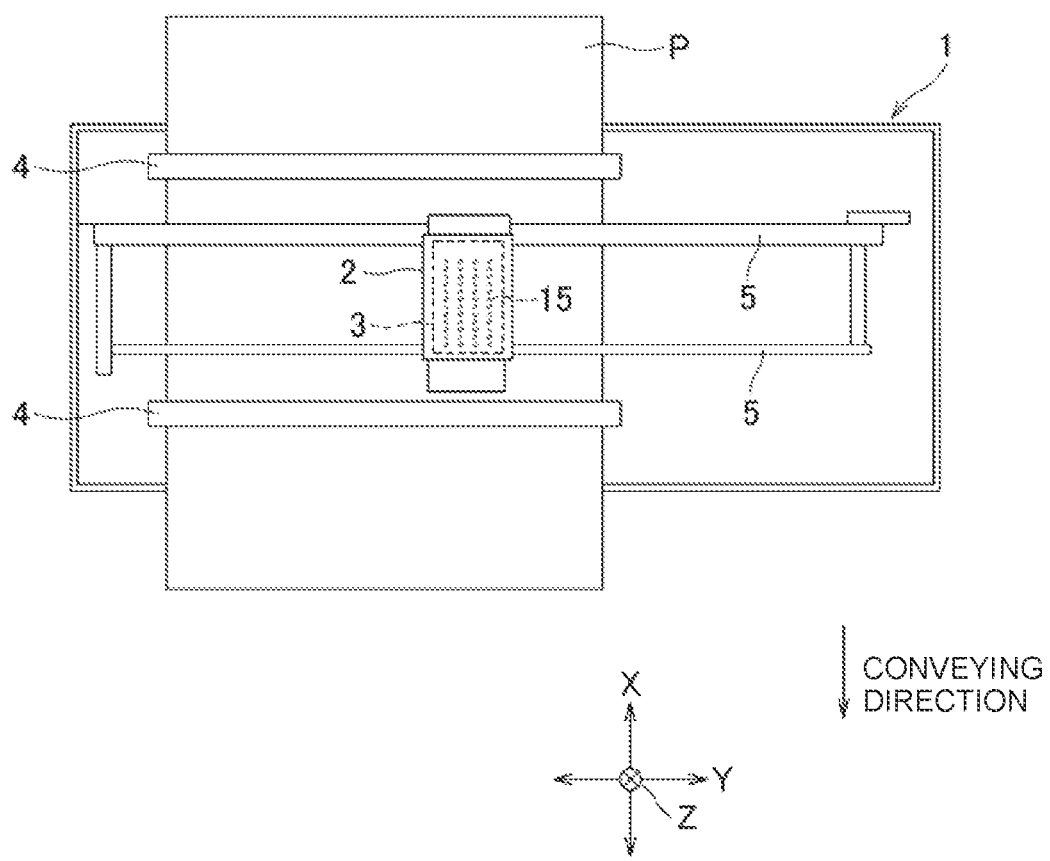
FIG. 1 is a plan view of a printer including a head according to a first embodiment of the present invention.

At first, an explanation will be made with reference to FIG. 1 about the overall configuration of a printer 1 including a head 3 according to a first embodiment of the present invention.

Note that in the following explanation, the Z direction is the vertical direction, and the X direction and the Y direction are the horizontal directions. Both of the X direction and the Y direction are orthogonal to the Z direction. The X direction is orthogonal to the Y direction.

The printer 1 is provided with the head 3, a carriage 2, and two conveying roller pairs 4.

The carriage 2 is supported by two guide rails 5 extending in the Y direction, and the carriage 2 is movable in the Y direction along the guide rails 5.

The head 3 is of the serial type. The head 3 is carried on the carriage 2, and the head 3 is movable in the Y direction together with the carriage 2. A plurality of nozzles 15 are formed on the lower surface of the head 3.

The two conveying roller pairs 4 are arranged while interposing the carriage 2 in the X direction. The conveying roller pairs 4 are rotated in a state in which the recording paper P is interposed. Accordingly, the recording paper P is conveyed in the conveying direction along with the X direction.

A controller (not depicted) of the printer 1 controls the carriage 2, the head 3, and the conveying roller pairs 4 to alternately perform the discharging action and the conveyance action. The discharging action is such an action that the ink is discharged from the nozzles 15 while moving the head 3 in the Y direction together with the carriage 2. The conveyance action is such an action that the recording paper P is conveyed by a predetermined amount in the conveying direction by means of the conveying roller pairs 4. Accordingly, an image is recorded on the recording paper P.

Next, an explanation will be made with reference to FIGS. 2 to 11 about the configuration of the head 3.

Figure 2:
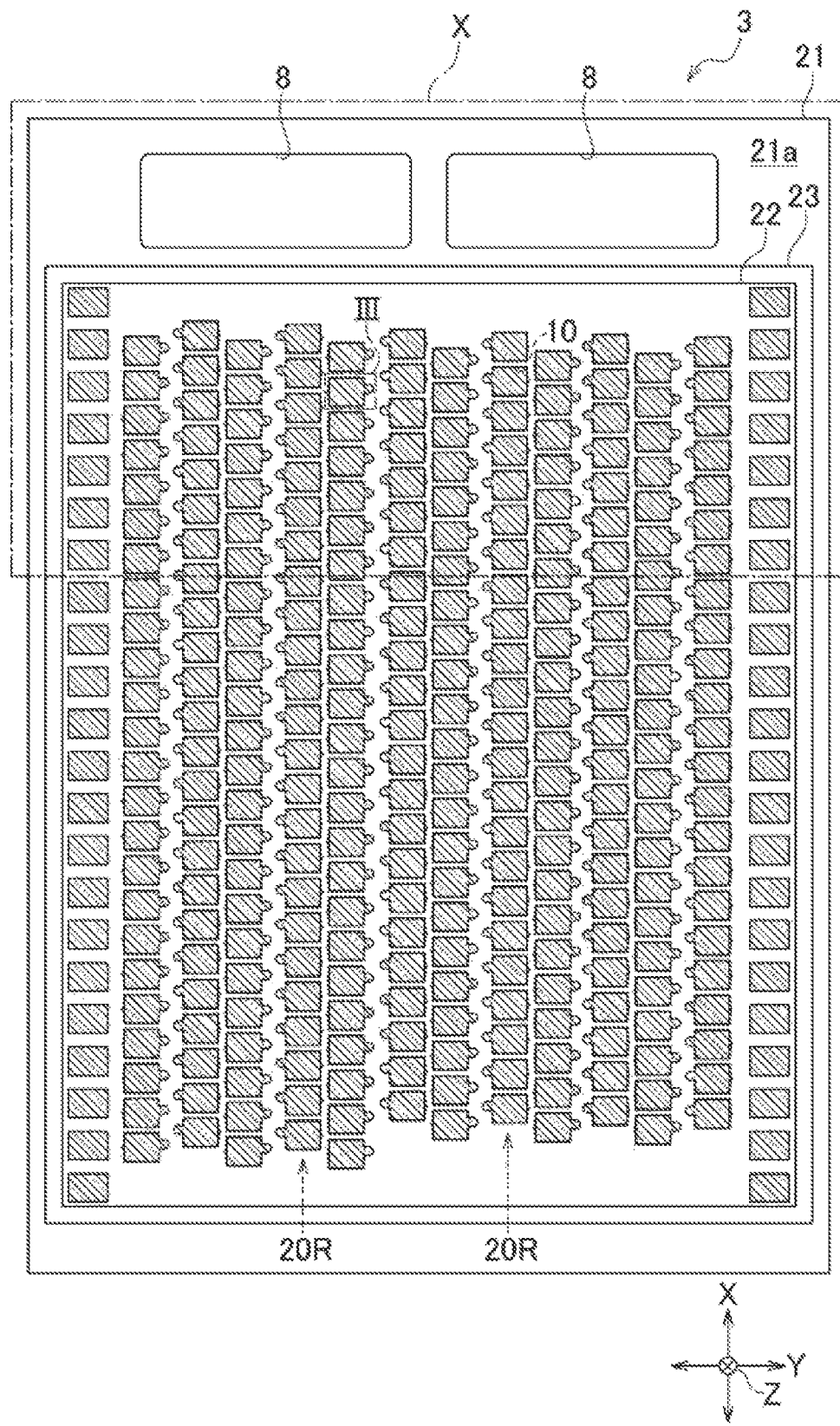
FIG. 2 is a plan view of the head depicted in FIG. 1.
Figure 4:
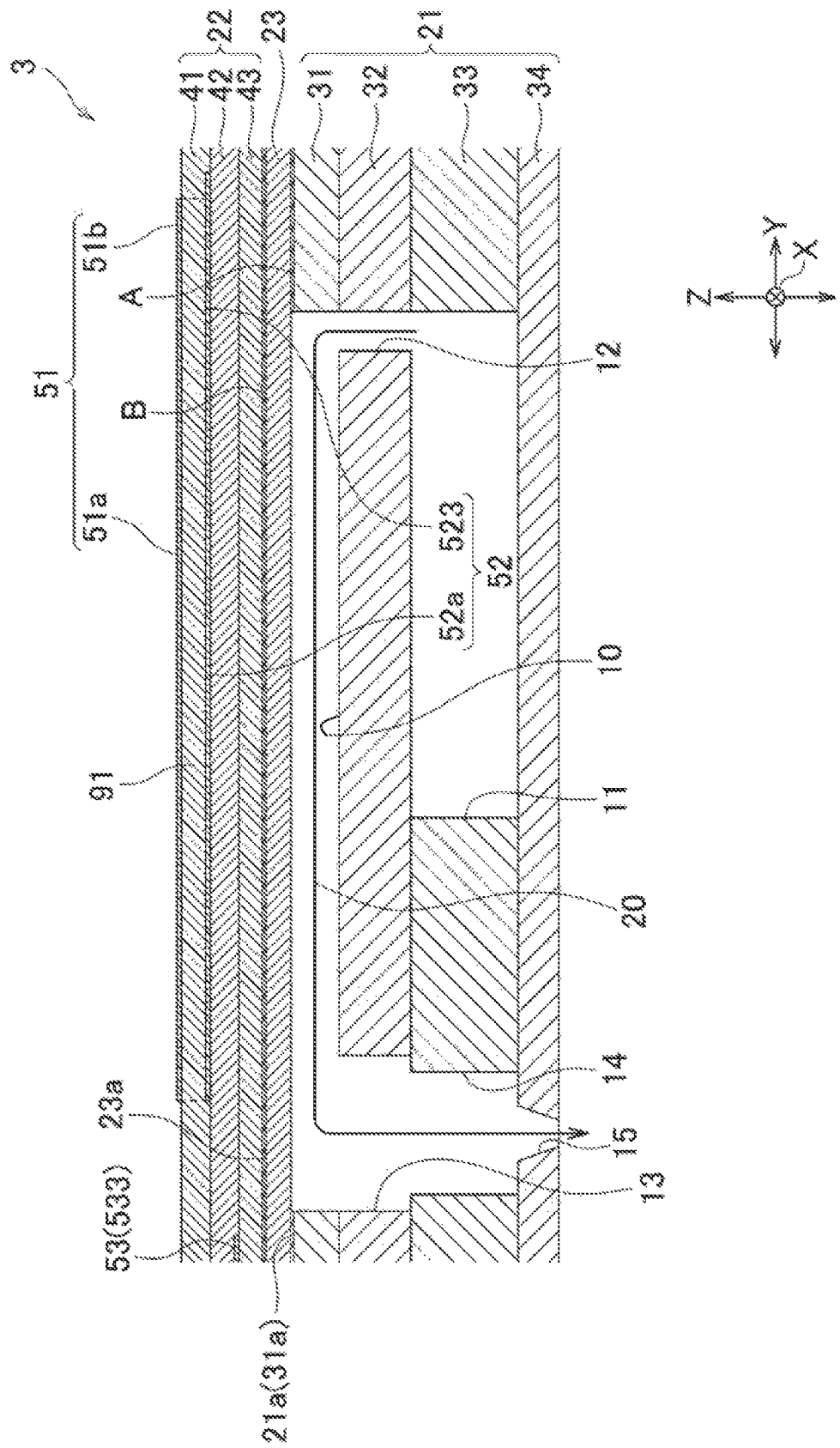
FIG. 4 is a sectional view taken along a line IV-IV depicted in FIG. 3.

As depicted in FIGS. 2 and 4, the head 3 has a flow passage member 21 which is formed with the plurality of nozzles 15, an actuator member 22, and a sealing member 23 which is arranged between the flow passage member 21 and the actuator member 22. As depicted in FIG. 2, all of the flow passage member 21, the actuator member 22, and the sealing member 23 have rectangular shapes in each of which the length in the X direction is longer than the length in the Y direction on the plane orthogonal to the Z direction. The sealing member 23 has a size which is one side smaller than the flow passage member 21 and which is one size larger than the actuator member 22 on the plane orthogonal to the Z direction.

As depicted in FIG. 4, the flow passage member 21 is configured by four plates 31 to 34 each of which is made of metal and which are stacked in the Z direction.

Through-holes, which define a plurality of pressure chambers 10, are formed through the plate 31 ("pressure chamber plate" of the present invention). Through-holes, which define communication passages 12, 13 provided for each of the pressure chambers 10, are formed through the plate 32. The communication passages 12, 13 are overlapped in the Z direction with one end and the other end in the Y direction of the corresponding pressure chamber 10 respectively. Through-holes, which define communication passages 14 each provided for each of the communication passages 13, are formed through the plate 33. The communication passage 14 is overlapped in the Z direction with the corresponding communication passage 13. Through-holes, which define the plurality of nozzles 15, are formed through the plate 34. Each of the nozzles 15 is overlapped in the Z direction with the communication passage 14.

In this way, the flow passage member 21 is formed with a plurality of individual flow passages 20. Each of the individual flow passages 20 includes the nozzle 15 and the pressure chamber 10 communicated with the nozzle 15. As depicted in FIG. 2, the plurality of individual flow passages 20 form twelve individual flow passage arrays 20R aligned in the Y direction. Each of the individual flow passage arrays 20R is formed by the plurality of individual flow passages 20 aligned in the X direction.

Further, as depicted in FIG. 4, through-holes, which define manifold flow passages 11, are formed through the plate 33. The manifold flow passage 11 is provided for each of the individual flow passage arrays 20R (see FIG. 2). Each of the manifold flow passages 11 extends in the X direction, and each of the manifold flow passages 11 is communicated with the plurality of individual flow passages 20 belonging to the corresponding individual flow passage array 20R.

The plurality of pressure chambers 10 are open on the surface 31a of the plate 31 (i.e., the surface 21a of the flow passage member 21). Further, two ink supply ports 8 are open in an area of the surface 31a of the plate 31 in which the actuator member 22 and the sealing member 23 are not arranged (see FIG. 2). Each of the ink supply ports 8 is communicated with an ink cartridge (not depicted) via a tube, and each of the ink supply ports 8 is communicated with the six manifold flow passages 11. The ink, which is supplied from the ink cartridge via the tube to each of the ink supply ports 8, is supplied to the six manifold flow passages 11. The ink is supplied from each of the manifold flow passages 11 via the communication passage 12 to the plurality of pressure chambers 10 belonging to each of the corresponding individual flow passage arrays 20R. Then, the actuator member 22 is driven as described later on, and thus the pressure is applied to the ink contained in the pressure chamber 10. The ink passes through the common flow passages 13, 14, and the ink is discharged from the nozzle 15.

The sealing member 23 is composed of a material (for example, stainless steel) having a low ink permeability. As depicted in FIG. 4, the sealing member 23 is adhered to the surface 31*a* of the plate 31 (i.e., the surface 21*a* of the flow passage member 21) via an adhesive A ("second adhesive" of the present invention) to seal all of the pressure chambers 10 formed for the plate 31. The thickness in the Z direction of the sealing member 23 is smaller than the thickness in the Z direction of the plate 31 (for example, the thickness of the sealing member 23 is 8 μm, and the thickness of the plate 31 is 100 μm).

The sealing member 23 and the respective plates 31 to 34 of the flow passage member 21 are retained at the low electric potential (GND electric potential), Accordingly, for example, the ink contained in the flow passage member 21 is suppressed from having any electric charge and suppressed from being easily coagulated. Further, the electric potentials of the flow passage member 21 and the sealing member 23 are suppressed from acting on the electrode of the actuator member 22 to cause any malfunction of the action or operation of the actuator member 22.

The actuator member 22 has three piezoelectric layers 41 to 43, a plurality of driving electrodes 51, a high electric potential electrode 52, and a low electric potential electrode 53.

Each of the three piezoelectric layers 41 to 43 is composed of a piezoelectric material containing a main component of, for example, lead zirconate titanate. The three piezoelectric layers 41 to 43 are stacked in the Z direction.

The lowermost piezoelectric layer 43, which is included in the three piezoelectric layers 41 to 43, corresponds to the "piezoelectric layer" of the present invention. The piezoelectric layer 43 is adhered to the surface 23*a* of the sealing member 23 (first surface disposed on a side opposite to the flow passage member 21) via an adhesive B. The adhesive B is an adhesive having the insulating property (for example, epoxy resin-based adhesive). The adhesives A, B may be composed of the same material respectively, or the adhesives A, B, may be composed of mutually different materials.

All of the driving electrodes 51, the high electric potential electrode 52, and the low electric potential electrode 53 are positioned on a side opposite to the sealing member 23 with respect to the piezoelectric layer 43.

As depicted in FIG. 3, each of the driving electrodes 51 is arranged on the surface of the piezoelectric layer 41, while corresponding to the pressure chamber 10. The driving electrode 51 has a main portion 51*a* and a protruding portion 51*b*. The main portion 51*a* is overlapped in the Z direction (first direction) with the approximately entire region of the corresponding pressure chamber 10. The protruding portion 51*b* protrudes in the Y direction from the main portion 51*a*, and the protruding portion 51*b* is not overlapped in the Z direction with the corresponding pressure chamber 10. The protruding portion 51*b* is provided with a contact which is to be electrically connected to COF (Chip On Film) (not depicted). Driver IC (not depicted), which is mounted on COF, selectively applies any one of the high electric potential (VDD electric potential) and the low electric potential (GND electric potential) individually to each of the driving electrodes 51 via the wiring of COF in accordance with the control performed by the controller.

Figure 7:
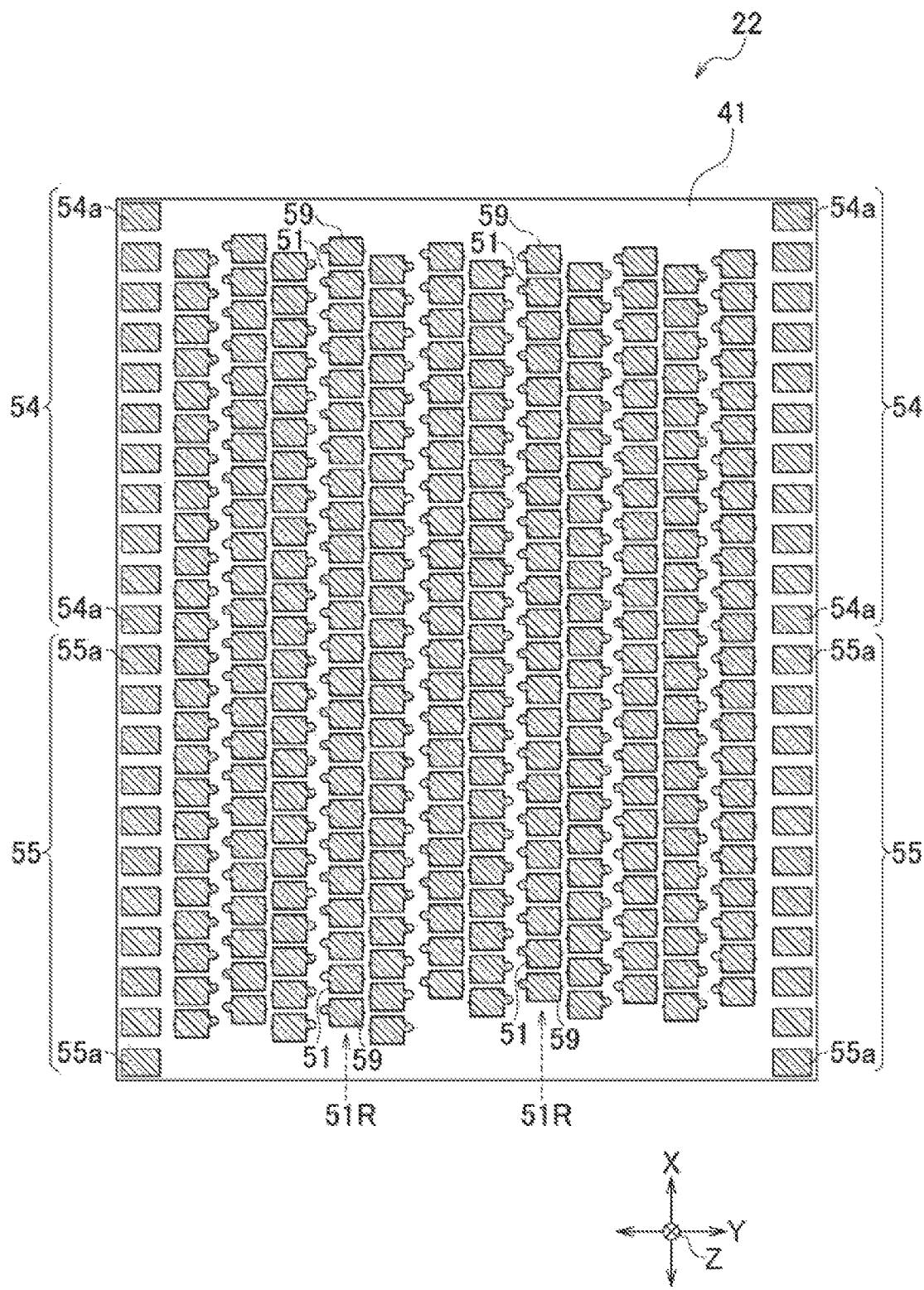
FIG. 7 is a plan view illustrative of a surface of an uppermost piezoelectric layer of three piezoelectric layers for constructing an actuator member depicted in FIG. 2.

As depicted in FIG. 7, the plurality of driving electrodes 51 form a plurality of driving electrode arrays 51R corresponding to the plurality of individual flow passage arrays 20R (see FIG. 2) respectively. Each of the driving electrode arrays 51R is formed by the plurality of driving electrodes 51 aligned in the X direction.

Dummy electrodes 59 are provided respectively on one side (upper side as viewed in FIG. 7) and the other side (lower side as viewed in FIG. 7) in the X direction for each of the driving electrode arrays 51R. The dummy electrode 59 has the same size and the same shape as those of the plurality of driving electrodes 51 belonging to the corresponding driving electrode array 51R. The dummy electrode is aligned at an equal interval in the X direction together with the driving electrode 51. The dummy electrode 59 is not electrically connected to COF, to which any electric potential is not applied. When the electrodes are formed by means of the screen printing along with the X direction, even if the thickness of the dummy electrode 59 disposed at the end portion in the X direction is decreased, then the thickness of the driving electrode 59 is not affected, and it is possible to appropriately form the driving electrode 51. Further, it is possible to suppress the difference in the shrinkage amount caused by the electrode formation between the driving electrode 51 disposed at the center in the X direction and the driving electrode 51 disposed at the end portion in the X direction in relation to each of the driving electrode arrays 51R. On this account, it is possible to suppress the dispersion in the discharge amount discharged from the plurality of nozzles 15 corresponding to each of the driving electrode arrays 51R.

Two high electric potential portions 54 and two low electric potential portions 55 are provided on the surface of the piezoelectric layer 41 in addition to the driving electrodes 51 and the dummy electrodes 59.

The two high electric potential portions 54 are arranged on one side (upper side as viewed in FIG. 7) in the X direction of the piezoelectric layer 41 at one end (left end as viewed in FIG. 7) and the other end (right end as viewed in FIG. 7) in the Y direction of the piezoelectric layer 41 respectively. The two low electric potential portions 55 are arranged on the other side (lower side as viewed in FIG. 7) in the X direction of the piezoelectric layer 41 at one end (left end as viewed in FIG. 7) and the other end (right end as viewed in FIG. 7) in the Y direction of the piezoelectric layer 41 respectively.

The high electric potential portion 54 and the low electric potential portion 55 are composed of a plurality of electrodes 54*a*, 55*a* which are arranged while being separated from each other in the X direction. The low electric potential portion 55 is also composed of a plurality of electrodes 55*a* which are arranged while being separated from each other in the X direction. The plurality of electrodes 54*a* and the plurality of electrodes 55*a* mutually have approximately the same size and approximately the same shape on the plane orthogonal to the Z direction. The driver IC applies the high electric potential (VDD electric potential) to the plurality of electrodes 54*a*, and the driver IC applies the low electric potential (GND electric potential) to the plurality of electrodes 55*a* via the wiring of COF in accordance with the control performed by the controller. The plurality of electrodes 54a are retained at the high electric potential, and the plurality of electrodes 55a are retained at the low electric potential.

Figure 8:
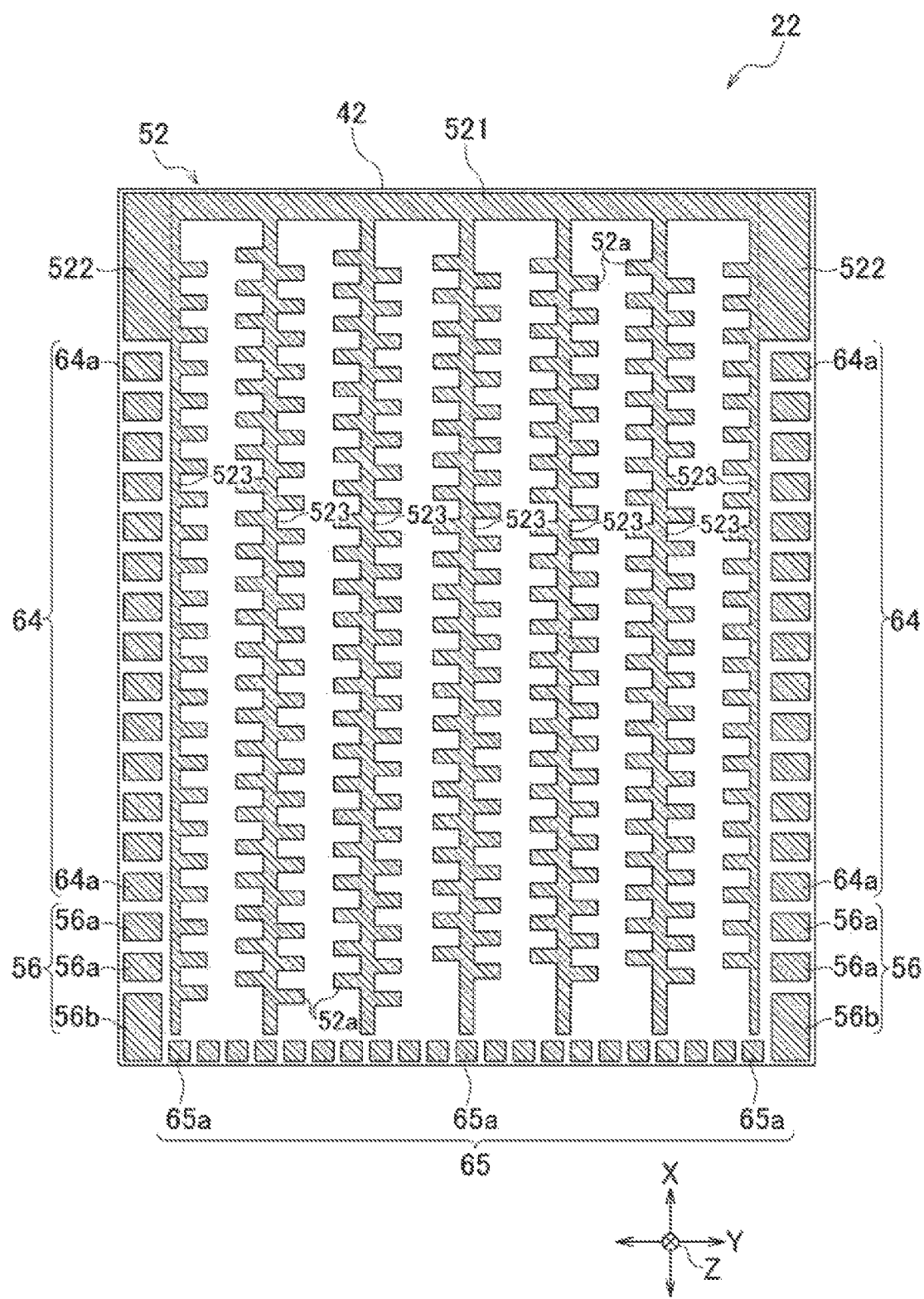
FIG. 8 is a plan view illustrative of a surface of the intermediate piezoelectric layer of the three piezoelectric layers.

As depicted in FIG. 8, the high electric potential electrode 52 is arranged on the surface of the piezoelectric layer 42. The high electric potential electrode 52 includes a stem portion 521, a plurality of branch portions 523 which are branched from the stem portion 521, a plurality of individual portions 52a which are provided for each of the branch portions 523, and two high electric potential receiving portions 522.

The stem portion 521 extends in the Y direction at one end in the X direction of the piezoelectric layer 42 (upper end as viewed in FIG. 8). The plurality of branch portions 523 extend from the stem portion 521 to the other side in the X direction (lower side as viewed in FIG. 8) respectively. The plurality of individual portions 52a correspond to the plurality of pressure chambers 10 and the plurality of driving electrodes 51 respectively. Each of the individual portions 52a has a portion which is overlapped in the Z direction with the central portion in the X direction of the corresponding pressure chamber 10 and which is overlapped in the Z direction with the corresponding driving electrode 51 (see FIG. 5).

One of the two high electric potential receiving portions 522 is connected to one end in the Y direction of the stem portion 521 (left end as viewed in FIG. 8), and the portion extends in the X direction at one end in the Y direction of the piezoelectric layer 42. The other of the two high electric potential receiving portions 522 is connected to the other end in the Y direction of the stem portion 521 (right end as viewed in FIG. 8), and the portion extends in the X direction at the other end in the Y direction of the piezoelectric layer 42. The two high electric potential receiving portions 522 are overlapped in the Z direction with the four electrodes 54a of the high electric potential portions 54 respectively (see FIG. 7). The respective high electric potential receiving portions 522 are electrically connected to the electrodes 54a via through-holes 41x (see FIG. 11) formed through the piezoelectric layer 41. The respective high electric potential receiving portions 522 receive the high electric potential from the electrodes 54a.

Two low electric potential portions 56, two floating electrode portions 64, and a floating electrode portion 65 are provided on the surface of the piezoelectric layer 42 in addition to the high electric potential electrode 52.

The two low electric potential portions 56 are arranged at one end (left end as viewed in FIG. 8) and the other end (right end as viewed in FIG. 8) in the Y direction of the piezoelectric layer 42 on the other side in the X direction of the piezoelectric layer 42 (lower side as viewed in FIG. 8) respectively. Each of the low electric potential portions 56 is composed of two electrodes 56a and one electrode 56b which are arranged while being separated from each other in the X direction.

The two floating electrode portions 64 are arranged at one end (left end as viewed in FIG. 8) and the other end (right end as viewed in FIG. 8) in the Y direction of the piezoelectric layer 42 respectively. Each of the floating electrode portions 64 is arranged between the high electric potential receiving portion 522 and the low electric potential portion 56 in the X direction. Each of the floating electrode portions 64 is composed of a plurality of floating electrodes 64a which are arranged while being separated from each other in the X direction.

The floating electrode portion 65 is arranged at the other end in the X direction of the piezoelectric layer 42 (lower end as viewed in FIG. 8). The floating electrode portion 65 is composed of a plurality of floating electrodes 65a which are arranged while being separated from each other in the Y direction.

The size and the shape of the four electrodes 56a of the two low electric potential portions 56, which are provided on the plane orthogonal to the Z direction, are approximately the same as those of the plurality of floating electrodes 64a of the two floating electrode portions 64. The two electrodes 56a and the plurality of floating electrodes 64a are arranged at equal intervals in the X direction at one end (left end as viewed in FIG. 8) of the piezoelectric layer 42. The two electrodes 56a and the plurality of floating electrodes 64a are also arranged at equal intervals in the X direction at the other end (right end as viewed in FIG. 8) in the Y direction of the piezoelectric layer 42. On the other hand, the electrode 56b of each of the low electric potential portions 56 has the length in the X direction which is longer than that of each of the electrodes 56a.

The electrodes 56a, 56b of the respective low electric potential portions 56 are overlapped in the Z direction with the four electrodes 55a of the corresponding low electric potential portion 55 (see FIG. 7). The electrodes 56a, 56b are electrically connected to the electrodes 55a via through-holes (not depicted) formed through the piezoelectric layer 41. The electrodes 56a, 56b receive the low electric potential from the electrodes 55a.

The respective floating electrodes 64a, 65a of the floating electrode portions 64, 65 are not electrically connected to any electrode, and no electric potential is applied thereto.

Figure 9:
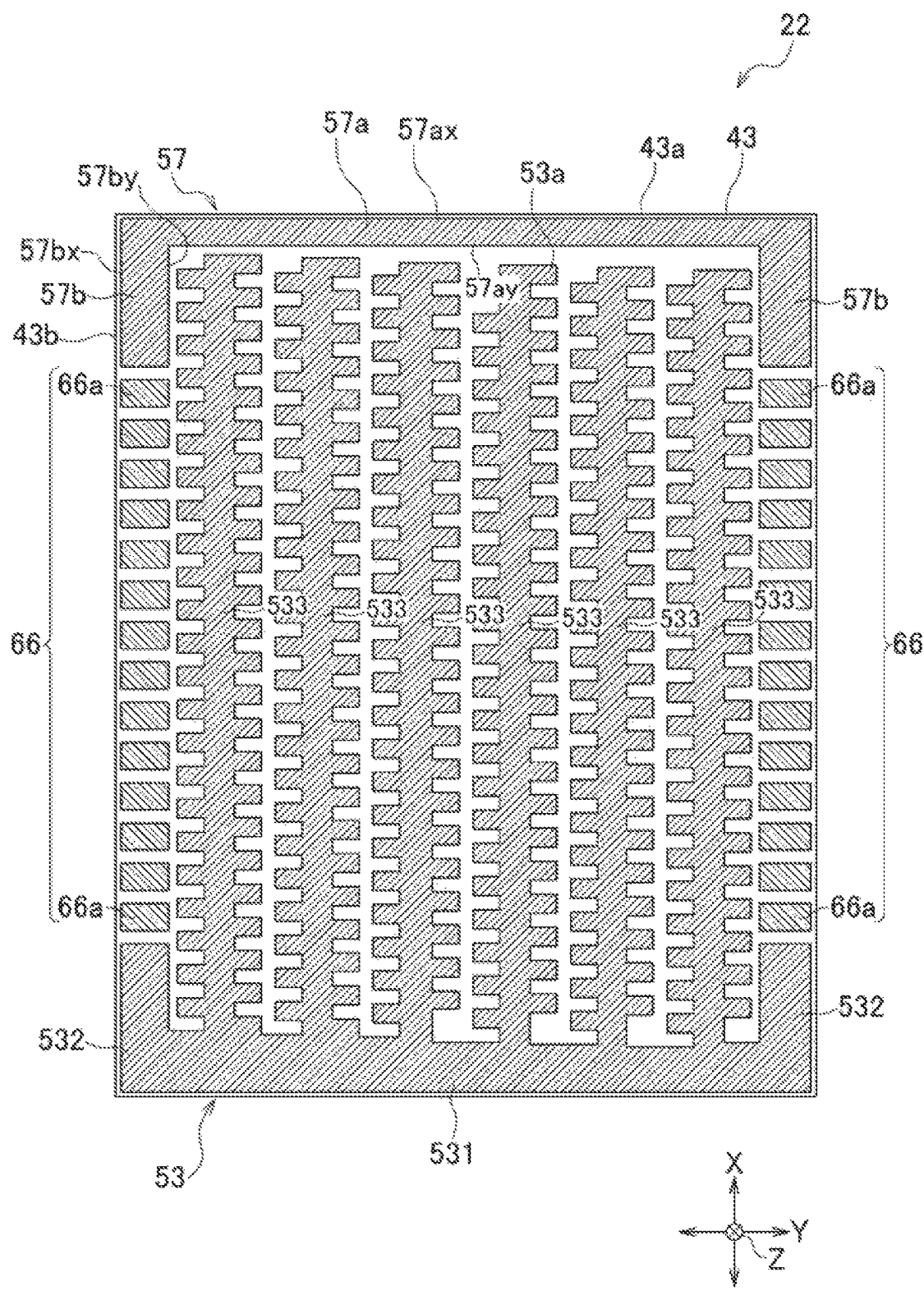
FIG. 9 is a plan view illustrative of a surface of the lowermost piezoelectric layer of the three piezoelectric layers.

As depicted in FIG. 9, the low electric potential electrode 53 is arranged on the surface of the piezoelectric layer 43. The low electric potential electrode 53 includes a stem portion 531, a plurality of branch portions 533 which are branched from the stem portion 531, a plurality of individual portions 53a which are provided for each of the branch portions 533, and two low electric potential receiving portions 532.

The stem portion 531 extends in the Y direction at the other end in the X direction of the piezoelectric layer 43 (lower end as viewed in FIG. 9). The plurality of branch portions 533 extend from the stem portion 531 to one side in the X direction (upper side as viewed in FIG. 9) respectively. Each of the individual portions 53a, which is included in the plurality of individual portions 53a and from which the individual portions 53a positioned at one end and the other end in the X direction are excluded, has the portion which spreads over the two pressure chambers 10 that are adjacent to one another on the X direction and which is overlapped in the Z direction with the two pressure chambers 10 (see FIG. 5). Each of the individual portion 53a which is positioned at one end in the X direction and the individual portion 53a which is positioned at the other end in the X direction has the portion which is overlapped in the Z direction with one pressure chamber 10. Further, each of the individual portions 53a has the portion which is overlapped in the Z direction with each of the driving electrodes 51 (see FIG. 5).

One of the two low electric potential receiving portions 532 is connected to one end in the Y direction of the stem portion 531 (left end as viewed in FIG. 9), and the portion extends in the X direction at one end in the Y direction of the piezoelectric layer 43. The other of the two low electric potential receiving portions 532 is connected to the other end in the Y direction of the stem portion 531 (right end as viewed in FIG. 9), and the portion extends in the X direction at the other end in the Y direction of the piezoelectric layer 43. Each of the two low electric potential receiving portions 532 is overlapped in the Z direction with the four electrodes 55a of the low electric potential portion 55 (see FIG. 7) and the electrodes 56a, 56b of the low electric potential portion 56 (see FIG. 8). The respective low electric potential receiving portions 532 are electrically connected to the corresponding electrodes 56a, 56b via through-holes (not depicted) formed through the piezoelectric layer 42, and the respective low electric potential receiving portions 532 receive the low electric potential from the electrodes 56a, 56b.

A high electric potential portion 57 and two floating electrode portions 66 are provided on the surface of the piezoelectric layer 43 in addition to the low electric potential electrode 53.

The high electric potential portion 57 has a first portion 57a which extends in the direction and two second portions 57b which extend in the X direction.

The first portion 57a extends in the Y direction at one end in the X direction of the piezoelectric layer 43 (upper end as viewed in FIG. 9).

One of the two second portions 57b is connected to one end in the Y direction of the first portion 57a (left end as viewed in FIG. 9), and the portion extends in the X direction at one end in the Y direction of the piezoelectric layer 43. The other of the two second portions 57b is connected to the other end in the Y direction of the first portion 57a (right end as viewed in FIG. 9), and the portion extends in the X direction at the other end in the Y direction of the piezoelectric layer 43. Each of the two second portions 57b is overlapped in the Z direction with the four electrodes 54a of the high electric potential portion 54 (see FIG. 7) and the high electric potential receiving portion 522 of the high electric potential electrode 52 (see FIG. 8). Each of the second portions 57h is electrically connected to the corresponding high electric potential receiving portion 522 via a through-hole 42x (see FIG. 11) formed through the piezoelectric layer 42, and the portion receives the high electric potential from the high electric potential receiving portion 522.

The two floating electrode portions 66 are arranged respectively at one end (left end as viewed in FIG. 9) and the other end (right end as viewed in FIG. 9) in the Y direction of the piezoelectric layer 43. Each of the floating electrodes 66 is arranged between the second portion 57b and the low electric potential receiving portion 532 in the X direction. Each of the floating electrode portions 66 is composed of a plurality of floating electrodes 66a which are arranged while being separated from each other in the X direction. The plurality of floating electrodes 66a have approximately the same size and approximately the same shape on the plane orthogonal to the Z direction, and the floating electrodes 66a are arranged at equal intervals in the X direction.

The respective floating electrodes 66a of the floating electrode portion 66 are not electrically connected to any electrode, to which no electric potential is applied.

Figure 5:
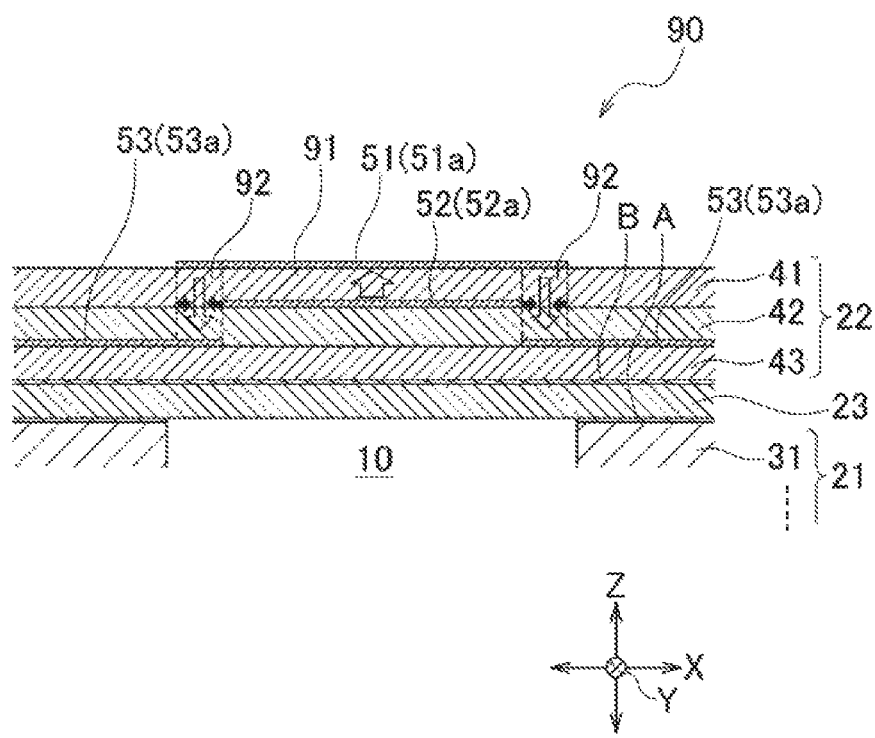
FIG. 5 is a sectional view taken along a line V-V depicted in FIG. 3.

As depicted in FIG. 5, the portion of the piezoelectric layer 41, which is interposed between the driving electrode 51 and the individual portion 52a of the high electric potential electrode 52 in the Z direction, is referred to as "first active portion 91". The portions of the piezoelectric layers 42, 43, which are interposed between the driving electrode 51 and the individual portion 53a of the low electric potential electrode 53 in the Z direction, are referred to as "second active portion 92". The first active portion 91 is mainly polarized in the upward direction, and the second active portion 92 is mainly polarized in the downward direction. The actuator member 22 has the actuator portion 90 for each of the pressure chambers 10. Each of the actuator portions 90 is configured by one first active portion 91 and the two active portions 92 that interpose the first active portion 91 in the X direction.

An explanation will now be made with reference to FIG. 6A and FIG. 6B about the action or operation of the actuator portion 90 corresponding to the nozzle 15 when the ink is discharged from the certain nozzle 15.

Figure 6A:
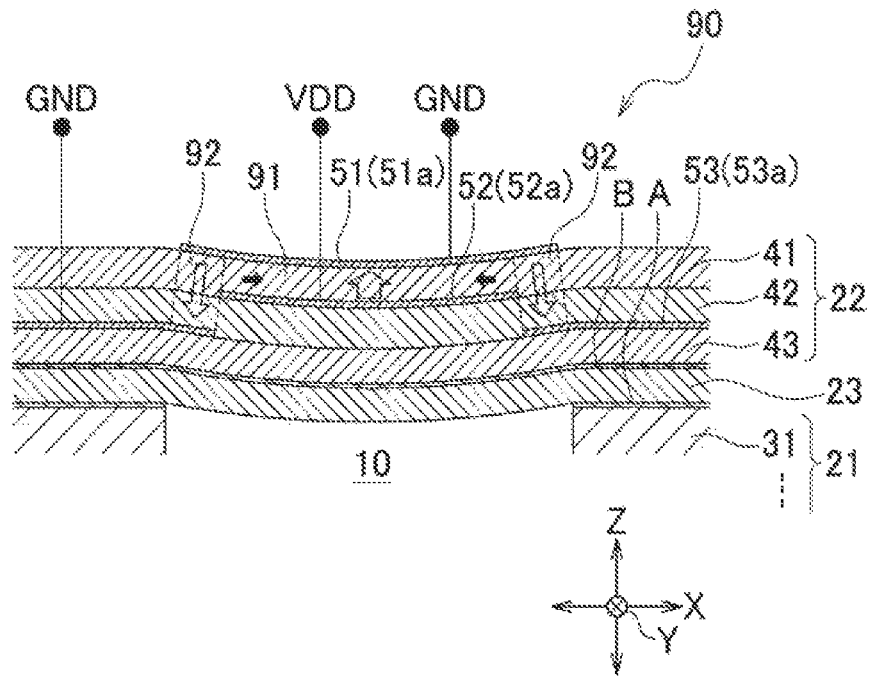
FIGS. 6A and 6B depict an action of an actuator portion in the cross section of FIG. 5.

As depicted in FIG. 6A, the low electric potential (GND electric potential) is applied to each of the driving electrodes 51 before the printer 100 begins the recording action. In this situation, the electric field, which is directed in the upward direction that is equal to the polarization direction, is generated in the first active portion 91 in accordance with the electric potential difference between the driving electrode 51 and the high electric potential electrode 52, and the first active portion 91 is shrunk in the in-plane direction (direction directed in the X direction and the Y direction). Accordingly, the portion of the stack composed of the piezoelectric layers 41 to 43, which is overlapped in the Z direction with the pressure chamber 10, is warped or flexibly bent so that the portion protrudes toward the pressure chamber 10 (in the downward direction). In this situation, the pressure chamber 10 has the small volume as compared with a case in which the stack is flat.

Figure 6B:
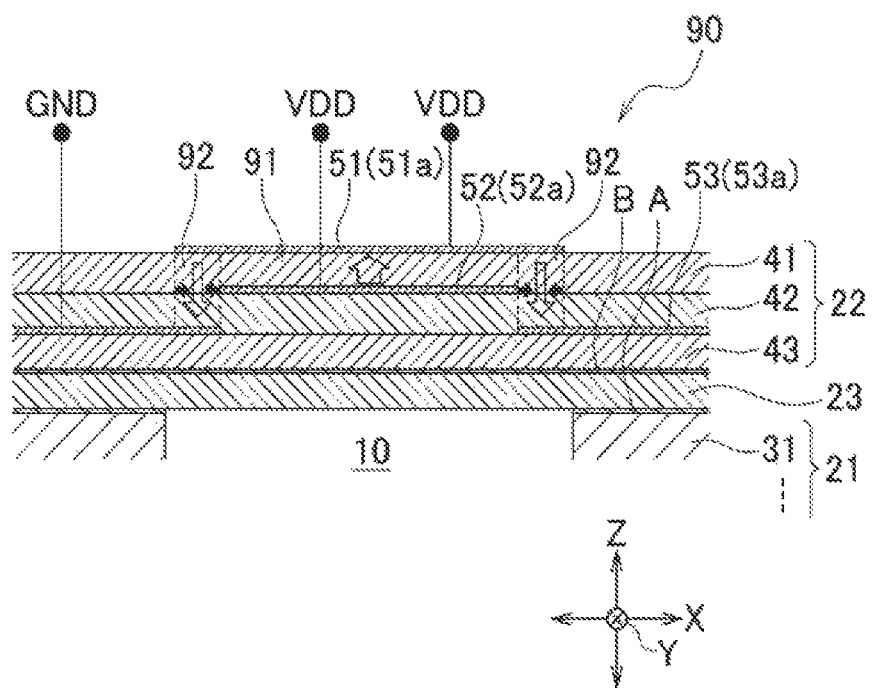

When the printer 100 starts the recording action to discharge the ink from the certain nozzle 15, the electric potential of the driving electrode 51 corresponding to the concerning nozzle 15 is firstly switched from the low electric potential (GND electric potential) to the high electric potential (VDD electric potential) as depicted in FIG. 6B. In this situation, the electric potential difference disappears between the driving electrode 51 and the high electric potential electrode 52, and thus the shrinkage of the first active portion 91 is canceled. On the other hand, the electric potential difference appears between the driving electrode 51 and the low electric potential electrode 53. Accordingly, the electric field, which is in the downward direction that is equal to the polarization direction, is generated in the second active portion 92, and the second active portion 92 is shrunk in the in-plane direction. However, the second active portion 92 has the function to suppress the crosstalk (such a phenomenon that the pressure fluctuation, which is accompanied by the deformation of the actuator portion 90 in relation to a certain pressure chamber 10, is transmitted to another pressure chamber 10 adjacent to the concerning pressure chamber 10). The second active portion 92 scarcely contributes to the deformation of the actuator portion 90. In other words, in this situation, the stack is not warped or flexibly bent so that the portion, which is overlapped in the Z direction with the pressure chamber 10, protrudes in the direction (in the upward direction) to make separation from the pressure chamber 10, but the stack is in a flat state. Accordingly, the volume of the pressure chamber 10 is increased as compared with the situation depicted in FIG. 6A.

After that, as depicted in FIG. 6A, the electric potential of the driving electrode 51 corresponding to the concerning nozzle 15 is switched from the high electric potential (VDD electric potential) to the low electric potential (GND electric potential). In this situation, the electric potential difference disappears between the driving electrode 51 and the low electric potential electrode 53, and thus the shrinkage of the second active portion 92 is canceled. On the other hand, the electric potential difference appears between the driving electrode 51 and the high electric potential electrode 52.

Accordingly, the electric field, which is in the upward direction that is equal to the polarization direction, is generated in the first active portion 91, and the first active portion 91 is shrunk in the in-plane direction. Accordingly, the portion of the stack, which is overlapped in the Z direction with the pressure chamber 10, is warped or flexibly bent so that the portion protrudes toward the pressure chamber 10 (in the downward direction). In this situation, the volume of the pressure chamber 10 is greatly decreased. Accordingly, the large pressure is applied to the ink contained in the pressure chamber 10, and the ink is discharged from the nozzle 15.

In this embodiment, the high electric potential portion 57 corresponds to the "high electric potential portion" of the present invention. The first portion 57a of the high electric potential portion 57 is arranged at the end portion in the X direction of the piezoelectric layer 43 (in this case, the X direction corresponds to the "second direction" of the present invention). The second portion 57b of the high electric potential portion 57 is arranged at the end portion in the Y direction of the piezoelectric layer 43 (in this case, the Y direction corresponds to the "second direction" of the present invention).

In this embodiment, as depicted in FIG. 10, a recess 70, which is overlapped in the Z direction with the high electric potential portion 57 (see FIG. 9), is formed on the surface 21a of the flow passage member 21. The recess 70 includes a first recess 71 which is overlapped in the Z direction with the first portion 57a of the high electric potential portion 57 and second recesses 72 which are overlapped in the Z direction with the second portions 57b of the high electric potential portion 57.

Each of the first recess 71 and the second recess 72 is not overlapped in the Z direction with the entire first portion 57a and the entire second portion 57b. Each of the first recess 71 and the second recess 72 is overlapped in the Z direction with the edge in the X direction of the first portion 57a and the edge in the Y direction of the second portion 57b.

Specifically, as depicted in FIG. 9, the edge in the X direction of the first portion 57a includes an outer edge 57ax and an inner edge 57ay. The distance in the X direction from an edge 43a in the X direction of the piezoelectric layer 43 to the inner edge 57ay is longer than the distance in the X direction from the edge 43a to the outer edge 57ax. The first recess 71 is formed along the outer edge 57ax of the first portion 57a, In other words, the first recess 71 is overlapped in the Z direction with the outer edge 57ax of the first portion 57a, but the first recess 71 is not overlapped in the Z direction with the portions other than the outer edge 57ax of the first portion 57a (portions including the inner edge 57ay).

As depicted in FIG. 10, the surface 21a of the flow passage member 21 has a pressure chamber area R as an area in which the plurality of pressure chambers 10 are arranged. A release groove 80, which is provided to release the adhesive A (see FIG. 4), is formed outside the pressure chamber area R on the surface 21a. The distance in the X direction from the pressure chamber area R to the inner edge 57ay of the first portion 57a is shorter than the distance in the X direction from the pressure chamber area R to the outer edge 57ax. It is necessary to secure the space for the release groove 80 at the portion of the surface 21a which is overlapped in the Z direction with the inner edge 57ay of the first portion 57a. It is difficult to form the recess 70. On this account, in this embodiment, the first recess 71 is not formed along the inner edge 57ay of the first portion 57a. The first recess 71 is formed along the outer edge 57ax of the first portion 57a.

Note that the recess 70 and the release groove 80 are not any space for constructing the ink flow passage such as the pressure chamber 10.

The edge in the Y direction of the second portion 57b includes an outer edge 57bx and an inner edge 57by. The distance in the Y direction from the edge 43b in the Y direction of the piezoelectric layer 43 to the inner edge 57by is longer than the distance in the Y direction from the edge 43h to the outer edge 57bx. The second recess 72 has a portion 72x which extends along the outer edge 57bx of the second portion 57b and a portion 72y which extends along the inner edge 57by of the second portion 57b. In other words, the second recess 72 is overlapped in the Z direction with the outer edge 57bx and the inner edge 57by of the second portion 57h, but the second recess 72 is not overlapped in the Z direction with the area which is provided between the outer edge 57bx and the inner edge 57by of the second portion 57b.

Note that the high electric potential portion 57 is arranged on the side of one end (upper end as viewed in FIG. 9) in the X direction of the piezoelectric layer 43, and the low electric potential receiving portion 532 ("low electric potential portion" of the present invention) is arranged on the side of the other end (lower end as viewed in FIG. 9) in the X direction of the piezoelectric layer 43. The recess 70 is provided for the high electric potential portion 57, and the recess 70 is not provided for the low electric potential receiving portion 532 (i.e., the recess 70 is overlapped in the Z direction with the high electric potential portion 57, but the recess 70 is not overlapped in the Z direction with the low electric potential receiving portion 532).

As depicted in FIG. 11, the recess 70 is formed on the surface 31a of the plate 31. For example, the thickness of the plate 31 is 100μ, while the depth of the recess 70 is 20 to 50μ.

Figure 12:
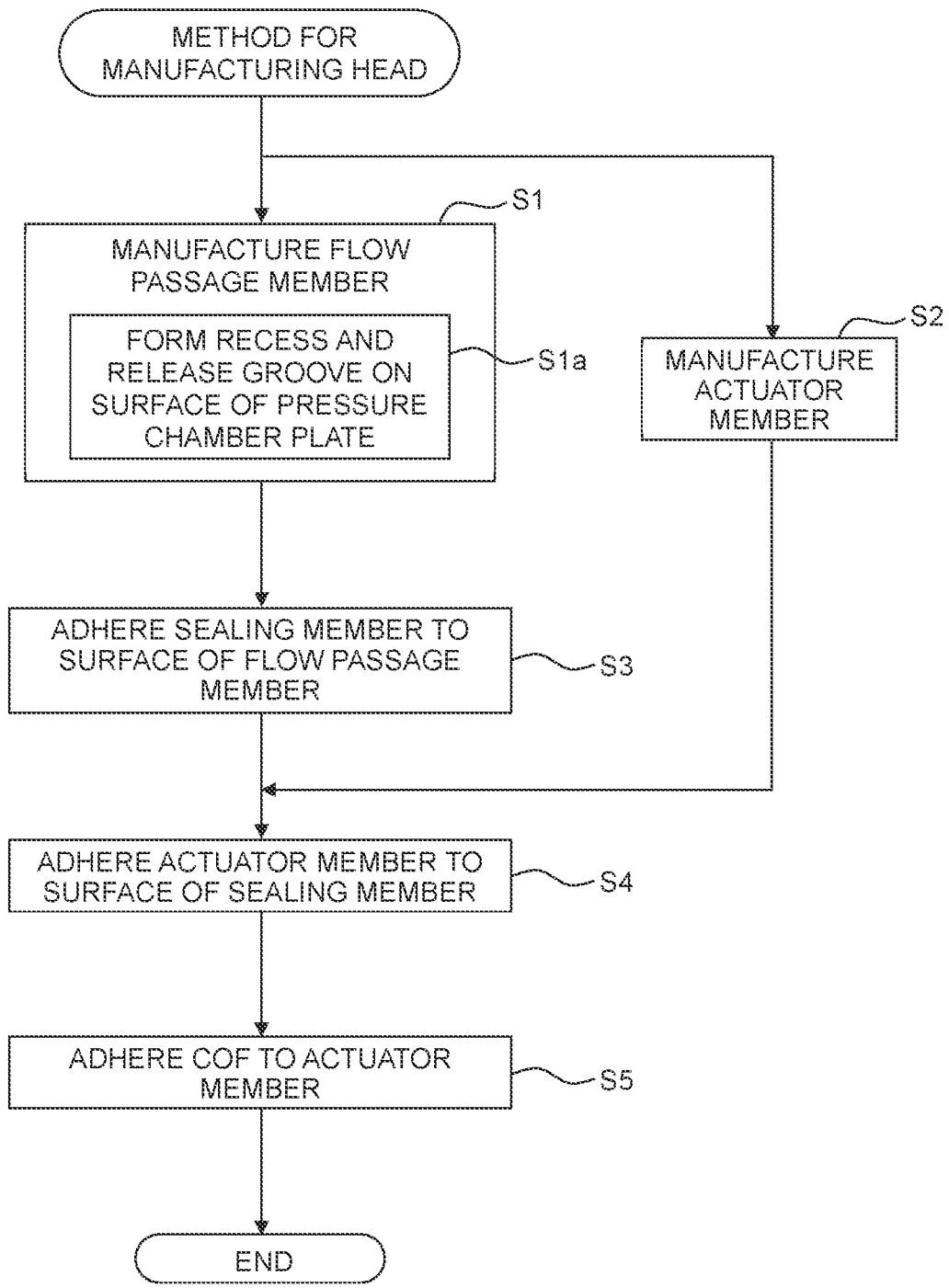
FIG. 12 is a flow illustrative of a method for manufacturing the head.

Next, an explanation will be made with reference to FIG. 12 about a method for manufacturing the head 3.

At first, a manufacturing step (S1) of manufacturing the flow passage member 21 and a manufacturing step (S2) of manufacturing the actuator member 22 are performed concurrently.

In the manufacturing step (S1) of manufacturing the flow passage member 21, the through-holes for constructing the flow passages are firstly formed through the plates 31 to 34 respectively for constructing the flow passage member 21. In this procedure, the recess 70 and the release groove 80 (see FIG. 10) are formed on the surface 31a of the plate 31 ("pressure chamber plate" of the present invention) (S1a: recess forming step). After that, the plates 31 to 34 are stacked, and the plates 31 to 34 are adhered to one another. Accordingly, the flow passage member 21 is completed.

In the manufacturing of the actuator member 22 (S2), the electrodes are firstly formed by means of the screen printing on the surfaces of the respective piezoelectric layers 41 to 43. After that, the piezoelectric layers 41 to 43 are stacked, and the piezoelectric layers 41 to 43 are sintered. Accordingly, the actuator member 22 is completed.

After S1 and S2, the adhesive A is transferred to the surface 21a of the flow passage member 21, and the sealing member 23 is adhered (S3: sealing step). Accordingly, the sealing member 23 is arranged on the surface 21a, and the pressure chambers 10 are sealed by the sealing member 23.

After S3, the adhesive B is dropped onto the surface 23*a* of the sealing member 23, and the piezoelectric layer 43 of the actuator member 22 is adhered by being pressurized (S4: adhering step).

After S4, COF is adhered to the actuator member 22 by using, for example, a conductive paste (S5), and thus the head 3 is completed. In S5, the wirings of COF are connected to the electrodes (the driving electrode 51 depicted in FIG. 7, the electrode 54*a* of the high electric potential portion 54, and the electrode 55*a* of the low electric potential portion 55) provided on the upper surface of the piezoelectric layer 41 of the actuator member 22 respectively.

As described above, according to this embodiment, the sealing member 23 is arranged between the flow passage member 21 and the piezoelectric layer 43 of the actuator member 22, and the piezoelectric layer 43 and the sealing member 23 are adhered to one another via the adhesive B having the insulating property (see FIG. 11). The sealing member 23 is retained at the low electric potential. The high electric potential portion 57 of the actuator member 22 has the first portion 57*a* which is arranged at one end (upper end as viewed in FIG. 9) in the X direction of the piezoelectric layer 43 and the two second portions 57*b* which are arranged at one end and the other end (left end and right end as viewed in FIG. 9) in the Y direction of the piezoelectric layer 43 respectively. In this configuration, the recess 70, which is overlapped in the Z direction with the high electric potential portion 57, is formed on the surface 21*a* of the flow passage member 21 (see FIGS. 10 and 11). In this case, the stress, which acts on the end portion of the piezoelectric layer 43 in S4 (adhering step) depicted in FIG. 12, can be mitigated by the recess 70. It is possible to suppress any crack which may appear at the end portion of the piezoelectric layer 43 (one end in the X direction at which the first portion 57*a* is arranged and one end and the other end in the Y direction at which the second portions 57*b* are arranged). Further, if the recess 70 is formed on the surface 23*a* of the sealing member 23 (i.e., the surface on which the adhesive B is provided), then the flow of the adhesive B is inhibited by the recess 70, and the adhesive B hardly diffuses to the end portion of the piezoelectric layer 43. In such a situation, the reliability of adhesion is lowered or deteriorated. Further, such a state arises that the adhesive B is absent at the end portion of the piezoelectric layer 43. Therefore, any crack may appear at the end portion of the piezoelectric layer 43. In relation thereto, in this embodiment, the recess 70 is formed on the surface 21*a* of the flow passage member 21. Therefore, the flow of the adhesive B is not inhibited by the recess 70. The adhesive B easily diffuses to the end portion of the piezoelectric layer 43. Therefore, it is possible to suppress both of the deterioration of the reliability of adhesion and the appearance of the crack at the end portion of the piezoelectric layer 43.

The recess 70 is overlapped in the Z direction with the edge of the high electric potential portion 57 (specifically, the outer edge 57*ax* of the first portion 57*a* and the outer edge 57*bx* and the inner edge 57*by* of the second portion 57*b* as depicted in FIG. 9) (see FIG. 11). The electric field is especially concentrated on the edge of the electrode, and the crack easily appears at the portion of the piezoelectric layer 43 corresponding to the edge. In this embodiment, the recess 70 is provided so that the recess 70 is overlapped in the Z direction with the edge of the high electric potential portion 57 at which the crack easily appears. Accordingly, it is possible to mitigate the stress caused by the concentration of the electric field, and it is possible to suppress the crack more reliably.

The release groove 80, which is provided to release the adhesive A (see FIG. 4), is formed at the outside of the pressure chamber area R on the surface 21*a* of the flow passage member 21 (see FIG. 10). The distance in the X direction from the pressure chamber area R to the inner edge 57*ay* of the first portion 57*a* (see FIG. 9) is shorter than the distance in the X direction from the pressure chamber area R to the outer edge 57*ax*. The first recess 71 is overlapped in the Z direction with the outer edge 57*ax* of the first portion 57*a* (see FIG. 9), and the first recess 71 is not overlapped in the Z direction with the inner edge 57*ay* of the first portion 57*a* (see FIG. 10). According to the configuration as described above, it is possible form the recess 70 and the release groove 80 without causing any interference with each other.

The recess 70 is not overlapped in the Z direction with at least a part of the high electric potential portion 57 (see FIGS. 10 and 11). In the production, it is difficult to increase the width while maintaining a constant depth of the recess 70. If the recess 70 is provided so that the recess 70 is overlapped in the Z direction with the entire high electric potential portion 57, the width (length in the Y direction) of the recess 70 is increased, in accordance with which the depth of the recess is increased as well, for example, with reference to FIG. 11. On this account, any wrinkle and/or any warpage may arise on the member (plate 31 in this embodiment) on which the recess 70 is formed, and any defect may occur in relation to the adhesion between the concerning member and another member. In relation thereto, in this embodiment, the recess 70 is provided so that the recess 70 is not overlapped in the Z direction with at least a part of the high electric potential portion 57. Therefore, it is possible to suppress the increase in the depth of the recess 70. That is, the wrinkle and the warpage hardly occur on the member (plate 31 in this embodiment) on which the recess 70 is formed, and it is possible to suppress the adhesion detect.

The high electric potential portion 57 is arranged on the side of one end (upper end as viewed in FIG. 9) in the X direction of the piezoelectric layer 43, and the low electric potential receiving portion 532 ("low electric potential portion" of the present teaching) is arranged on the side of the other end (lower end as viewed in FIG. 9) in the X direction of the piezoelectric layer 43. The recess 70 is provided for the high electric potential portion 57, and the recess 70 is not provided for the low electric potential receiving portion 532 (i.e., the recess 70 is overlapped in the Z direction with the high electric potential portion 57, but the recess 70 is not overlapped in the Z direction with the low electric potential receiving portion 532). The electric field is not generated at the portion of the piezoelectric layer 43 interposed by the sealing member 23 and the low electric potential receiving portion 532. Therefore, it is hardly necessary to provide the recess 70 for the low electric potential receiving portion 532. In this embodiment, the recess 70 is not provided for the low electric potential receiving portion 532. Therefore, the configuration is simplified, and it is easy to manufacture the head 3.

The recess 70 is formed on the plate 31 (pressure chamber plate) having the thickness larger than that of the sealing member 23. In this case, it is possible to form the recess 70 deeply. It is possible to form the recess 70 which has the sufficient depth to mitigate the stress (and consequently suppress the crack).

In S4 (adhering step), the adhesive B is dropped onto the surface 23*a* of the sealing member 23. For example, when the thickness of the piezoelectric layer 43 is small, any irregularity easily appears on the surface of the piezoelectric layer 43. On this account, it is difficult to adhere the piezoelectric layer 43 and the sealing member 23 by providing the adhesive B by means of the transfer. The adhering step is performed in some cases by dropping the adhesive B. When the adhesive B is dropped, the adhesive B hardly spreads to the end portion of the piezoelectric layer 43 as compared with when the adhesive B is transferred. The problem of the present teaching easily occurs (such a problem that any portion, at which the adhesive B does not intervene, appears between the sealing member 23 and the high electric potential portion 57 at the end portion of the piezoelectric layer 43, and the crack arises). In this embodiment, the recess 70 is provided in such a situation. Thus, it is possible to effectively solve the problem (problem of the occurrence of the crack at the end portion of the piezoelectric layer 43).

Second Embodiment

Figure 13:
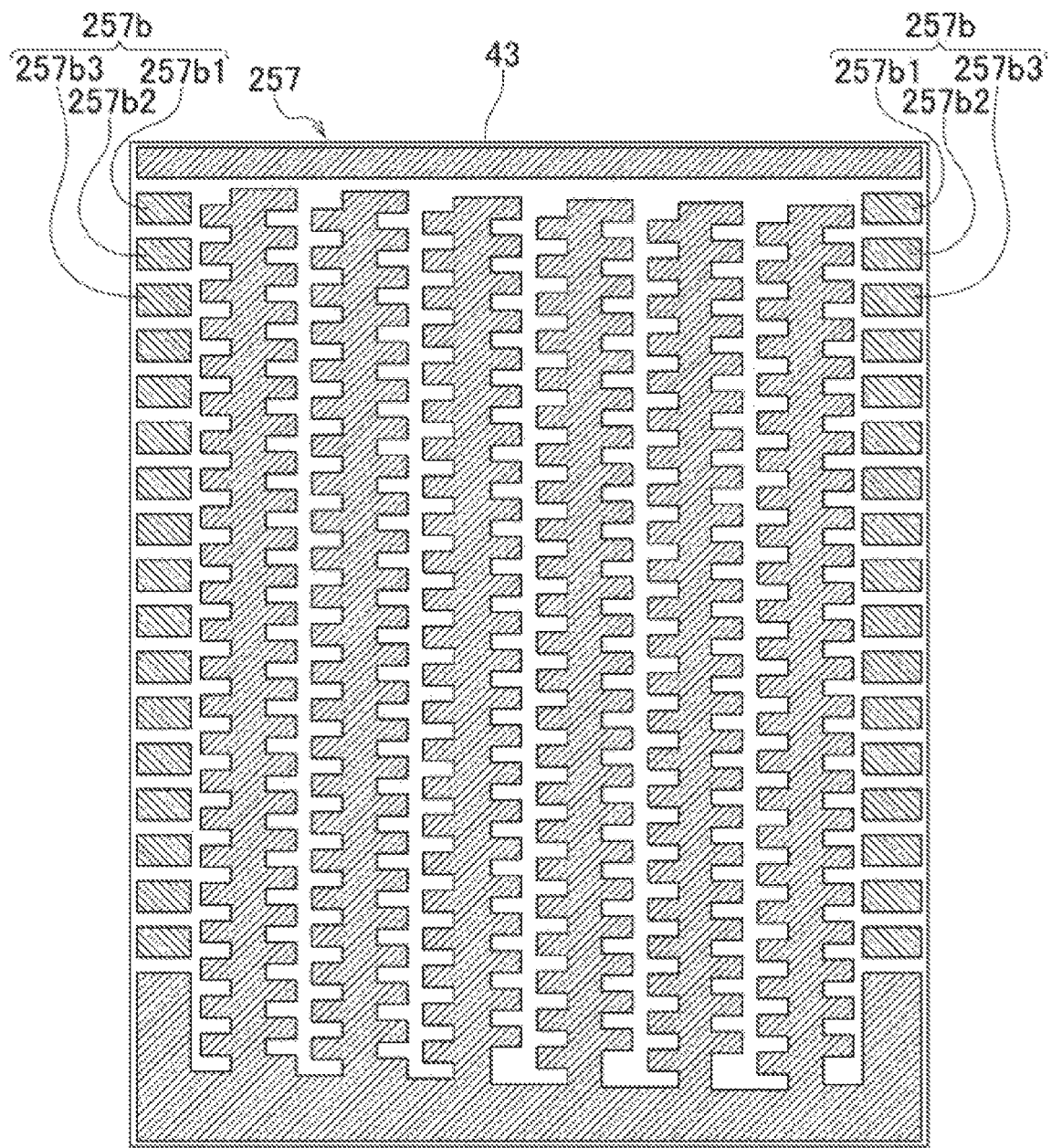
FIG. 13 is a plan view corresponding to FIG. 9 of a head according to a second embodiment of the present invention.

Next, an explanation will be made with reference to FIGS. 13 and 14 about a head according to a second embodiment of the present teaching.

In the first embodiment (FIG. 9), the two second portions 57b of the high electric potential portion 57 are long in the X direction respectively. On the other hand, in the second embodiment (FIG. 13), each of two second portions 257b of a high electric potential portion 257 includes three electrodes 257b1 to 257b3 which are aligned in the X direction (third direction when the Y direction is the second direction). Each of the electrodes 257b1 to 257b3 is overlapped in the Z direction with the electrode 54a of the high electric potential portion 54 (see FIG. 7) and the high electric potential receiving portion 522 of the high electric potential electrode 52 (see FIG. 8). Then, the electrodes 257b1 to 257b3 are electrically connected to the high electric potential receiving portions 522 via through-holes 42x formed through the piezoelectric layer 42 (see FIG. 11) to receive the high electric potential from the high electric potential receiving portions 522. Each of the electrodes 257b1 to 257b3 has the length in the X direction which is shorter than the length in the X direction of the second portion 57b of the first embodiment.

When the electrode, which is lengthy in the X direction, is provided, the warpage easily occurs at the end portion in the Y direction of the piezoelectric layer 43 on account of the thermal shrinkage caused during the sintering of the electrode. In relation thereto, in this embodiment, the three electrodes 257b1 to 257b3 are aligned in the X direction, and the length of each of the electrodes 257b1 to 257b3 in the X direction is shortened. Accordingly, the thermal shrinkage caused during the sintering of the electrode is dispersed in the X direction, and the warpage hardly appears.

Figure 14:
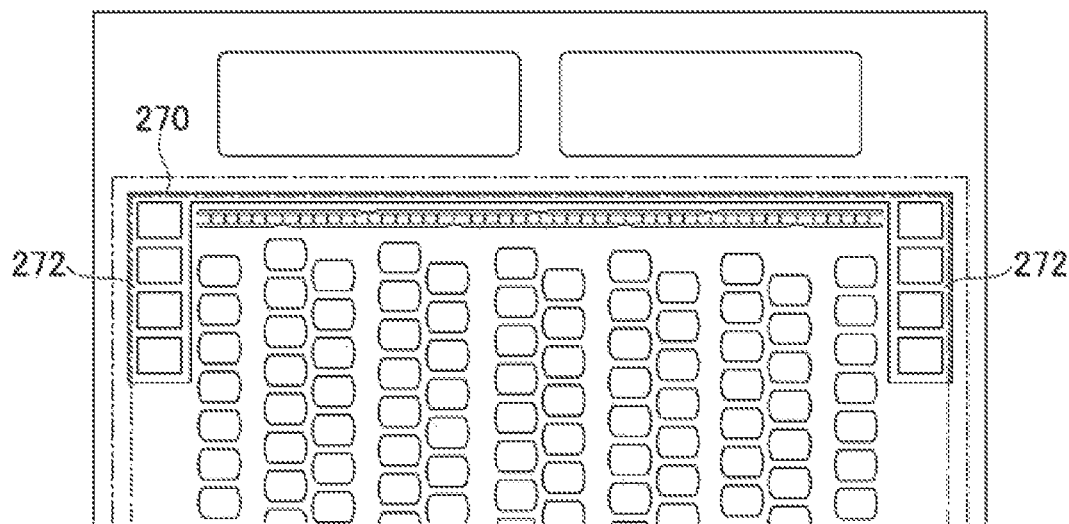
FIG. 14 is a plan view corresponding to FIG. 10 of the head according to the second embodiment of the present invention.

Further, in relation to a recess 270, second recesses 272, which correspond to the second portions 257b, are formed to surround the respective electrodes 257b1 to 257b3 as depicted in FIG. 14. Accordingly, it is possible to effectively suppress the crack generated at the portion of the piezoelectric layer 43 corresponding to the edge of each of the electrodes 257b1 to 257b3.

Third Embodiment

Figure 15:
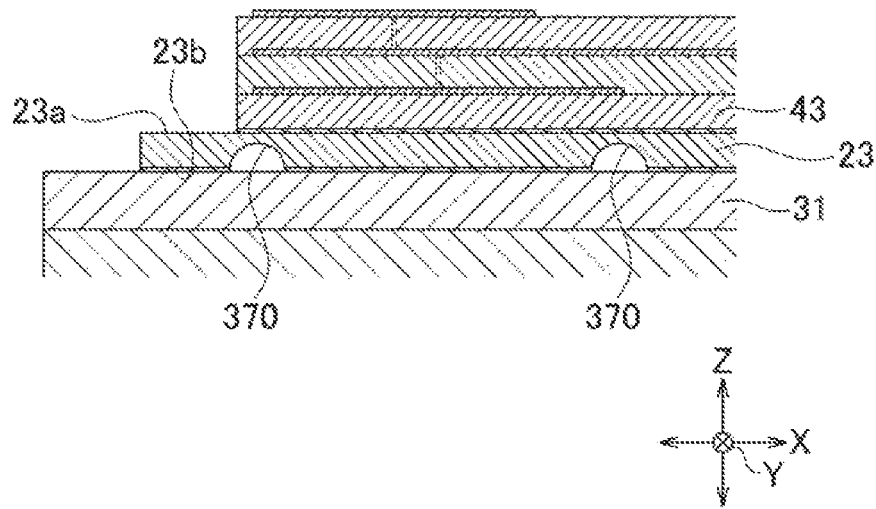
FIG. 15 is a plan view corresponding to FIG. 11 of a head according to a third embodiment of the present invention.

Next, an explanation will be made with reference to FIG. 15 about a head according to a third embodiment of the present teaching.

In the first embodiment (FIG. 11), the recess 70 is formed on the surface 21a of the flow passage member 21. On the other hand, in the third embodiment (FIG. 15), a recess 370 is formed on the back surface 23b of the sealing member 23 (second surface disposed on the side opposite to the surface 23a as the first surface). For example, the thickness of the sealing member 23 is 8μ, while the depth of the recess 370 is 4 to 5μ (smaller than the depth (for example, 20 to 50μ) of the recess 70 of the first embodiment).

According to this embodiment, the recess 370 is disposed nearer to the piezoelectric layer 43 in the Z direction as compared with the case (FIG. 11) in which the recess 70 is formed on the plate 31. The effect is enhanced to mitigate the stress and consequently suppress the crack) by means of the recess 370.

MODIFIED EMBODIMENTS

Preferred embodiments of the present teaching have been explained above. However, the present teaching is not limited to the embodiments described above, for which it is possible to variously change the design within a scope defined in claims.

The foregoing embodiment has been explained assuming that the high electric potential portion 57 (see FIG. 9) formed on the surface of the piezoelectric layer 43 is the "high electric potential portion" of the present teaching. However, there is no limitation thereto. For example, in the case of the configuration in which the floating electrode (for example, the electrode 66a depicted in FIG. 9) is arranged in place of the high electric potential portion 57 on the surface of the piezoelectric layer 43, the high electric potential receiving portion 522 and the stem portion 521 of the high electric potential electrode 52 (see FIG. 8) arranged on the surface of the piezoelectric layer 42 correspond to the "high electric potential portion" of the present teaching. The crack easily appears at one end (upper end as viewed in FIG. 8) in the X direction of the piezoelectric layer 42 provided with the stem portion 521 and one end (left end as viewed in FIG. 8) and the other end (right end as viewed in FIG. 8) in the Y direction of the piezoelectric layer 42 provided with the high electric potential receiving portion 522. However, it is possible to suppress the crack by providing the recess.

In the embodiment described above, the recess is formed on one of the surface 21a of the flow passage member 21 and the back surface 23b of the sealing member 23. However, the recess may be formed on both of the surface 21a of the flow passage member 21 and the back surface 23b of the sealing member 23.

The recess may be overlapped in the Z direction with any portion other than the edge of the high electric potential portion without being overlapped in the Z direction with the edge of the high electric potential portion 57. Further, the recess may be overlapped in the Z direction with the entire high electric potential portion.

In the embodiment described above, the high electric potential electrode 52 is positioned at the intermediate layer, and the low electric potential electrode 53 is positioned at the lowermost layer. However, the high electric potential electrode 52 may be positioned at the lowermost layer, and the low electric potential electrode 53 may be positioned at the intermediate layer.

The number of the piezoelectric layers for constructing the actuator member is three in the embodiment described above. However, there is no limitation thereto. Further, the actuator member is not limited to such a member that the actuator portion 90, which is composed of one first active portion 91 and two active portions 92, is formed for every pressure chamber 10 as depicted in FIGS. 5 and 6. The actuator member may have one active portion for every pressure chamber 10.

The present teaching is not limited to the printer. The present teaching is also applicable to facsimiles, copying machines, and multifunction machines. Further, the present teaching is also applicable to any liquid discharge apparatus to be used for any way of use other than the image recording (for example, a liquid discharge apparatus for forming a conductive pattern by discharging a conductive liquid to a substrate).

What is claimed is:

1. A liquid discharge head comprising:
    a flow passage member which is formed with a plurality of individual flow passages, each of the individual flow passages including a nozzle and a pressure chamber communicated with the nozzle, the flow passage member having a surface on which the pressure chamber is open;
    a sealing member which is arranged on the surface and configured to seal the pressure chamber; and
    an actuator member which has a piezoelectric layer, a driving electrode, and a high electric potential portion, the piezoelectric layer being adhered to a first surface of the sealing member on a side opposite to the flow passage member, via a first adhesive having an insulating property, the driving electrode being arranged on a side opposite to the sealing member with respect to the piezoelectric layer at a position overlapped with the pressure chamber in a first direction orthogonal to the surface, the high electric potential portion being arranged on a side opposite to the sealing member with respect to the piezoelectric layer at an end portion of the piezoelectric layer in a second direction orthogonal to the first direction,
    wherein any one of a high electric potential and a low electric potential lower than the high electric potential is selectively applied to the driving electrode,
    the high electric potential portion is retained at the high electric potential,
    the sealing member is retained at the low electric potential; and
    a recess, which is overlapped in the first direction with the high electric potential portion, is formed on at least one of the surface and a second surface of the sealing member on a side opposite to the first surface.

2. The liquid discharge head according to claim 1, wherein the recess is overlapped in the first direction with an edge of the high electric potential portion in the second direction.

3. The liquid discharge head according to claim 2,
    wherein the sealing member is adhered to the surface via a second adhesive,
    on the surface on which the recess is formed, a release groove, which is provided to release the second adhesive, is further formed outside a pressure chamber area in which the pressure chamber is arranged,
    the edge includes an outer edge and an inner edge,
    a distance in the second direction from the pressure chamber area to the inner edge is shorter than a distance in the second direction from the pressure chamber area to the outer edge, and
    the recess is overlapped with the outer edge in the first direction, and is not overlapped with the inner edge in the first direction.

4. The liquid discharge head according to claim 1, wherein the recess is not overlapped with at least a part of the high electric potential portion in the first direction.

5. The liquid discharge head according to claim 4,
    wherein the high electric potential portion includes a plurality of electrodes aligned in a third direction, which is orthogonal to the first direction and the second direction, and
    the recess is provided to surround the electrodes.

6. The liquid discharge head according to claim 1,
    wherein the high electric potential portion is arranged on a one end side of the piezoelectric layer in a third direction, which is orthogonal to the first direction and the second direction,
    a low electric potential portion, which is retained at the low electric potential, is arranged on the other end side of the piezoelectric layer in the third direction, and
    the recess is overlapped with the high electric potential portion in the first direction, and is not overlapped with the low electric potential portion in the first direction.

7. The liquid discharge head according to claim 1,
    wherein the flow passage member includes a pressure chamber plate which is formed with a through-hole for defining the pressure chamber and which has the surface, the pressure chamber plate having a thickness in the first direction which is larger than a thickness of the sealing member in the first direction, and
    the recess is formed on the surface.

8. The liquid discharge head according to claim 1, wherein the recess is formed on the second surface of the sealing member.

* * * * *